(12) United States Patent
Amaya et al.

(10) Patent No.: US 10,663,948 B2
(45) Date of Patent: May 26, 2020

(54) METHOD FOR THREE-DIMENSIONAL SHAPED PRODUCT WITH SETTING SHAPING ANGLE IN UNDERCUT REGION

(71) Applicant: Matsuura Machinery Corporation, Fukui, Fukui (JP)

(72) Inventors: Kouichi Amaya, Fukui (JP); Jun Kobayashi, Fukui (JP); Tatsuya Kabeshita, Fukui (JP)

(73) Assignee: Matsuura Machinery Corporation, Fukui, Fukui (JP)

( * ) Notice: Subject to any disclaimer, the term of this patent is extended or adjusted under 35 U.S.C. 154(b) by 351 days.

(21) Appl. No.: 15/900,968

(22) Filed: Feb. 21, 2018

(65) Prior Publication Data

US 2019/0041827 A1 Feb. 7, 2019

(30) Foreign Application Priority Data

Aug. 7, 2017 (JP) ................. 2017-152542

(51) Int. Cl.
*B29C 64/153* (2017.01)
*B33Y 10/00* (2015.01)
(Continued)

(52) U.S. Cl.
CPC ........ *G05B 19/4099* (2013.01); *B22F 3/1055* (2013.01); *B29C 64/153* (2017.08); *B29C 64/214* (2017.08); *B29C 64/268* (2017.08); *B29C 64/386* (2017.08); *B33Y 10/00* (2014.12); *B33Y 50/00* (2014.12); *B33Y 50/02* (2014.12);
(Continued)

(58) Field of Classification Search
None
See application file for complete search history.

(56) References Cited

U.S. PATENT DOCUMENTS 7,867,431 B2   1/2011  Higashi et al.
2007/0233298 A1* 10/2007  Heide .................... G06F 30/00
                                                700/98
(Continued)

FOREIGN PATENT DOCUMENTS

JP    2009-532804 A    9/2009
JP    2014-141105 A    8/2014
(Continued)

*Primary Examiner* — Kenneth M Lo
*Assistant Examiner* — Istiaque Ahmed
(74) *Attorney, Agent, or Firm* — Richard M. Goldberg

(57) ABSTRACT

A method for a three-dimensional shaped product produced by lamination, irradiation-based sintering and cutting, when undercut regions are present, comprising the steps of:
1. setting a model for the three-dimensional shaped product;
2. selecting a standard of undercut angle;
3. rotating the model in angle units;
4. calculating a total projected area on a horizontal plane of the undercut regions having angles crossing the horizontal plane which are smaller angles than a standard of undercut angle;
5. selecting a rotation angle such that the total projected area is either smallest or a prescribed standard value is reached;
6. when a minimum total area in step 5 is larger than a predetermined standard value or all of the total projected area in step 4 is larger than the predetermined standard value, sending a command to set a shaping region of a support section for supporting the undercut region.

8 Claims, 3 Drawing Sheets

(51) Int. Cl.
  *B29C 64/386*   (2017.01)
  *B33Y 50/00*    (2015.01)
  *G05B 19/4099*  (2006.01)
  *B22F 3/105*    (2006.01)
  *B33Y 50/02*    (2015.01)
  *B29C 64/214*   (2017.01)
  *B29C 64/268*   (2017.01)
  *G06F 30/00*    (2020.01)
  *B29C 64/40*    (2017.01)

(52) U.S. Cl.
  CPC ...... *G06F 30/00* (2020.01); *B22F 2003/1057* (2013.01); *B22F 2998/10* (2013.01); *B29C 64/40* (2017.08); *G05B 2219/49023* (2013.01); *Y02P 10/295* (2015.11)

(56) References Cited

U.S. PATENT DOCUMENTS

| | | | | |
|---|---|---|---|---|
| 2015/0066178 | A1* | 3/2015 | Stava | B29C 64/386 700/98 |
| 2016/0370793 | A1* | 12/2016 | Kobayashi | G05B 19/4099 |
| 2017/0176979 | A1* | 6/2017 | Lalish | B33Y 50/02 |
| 2017/0312986 | A1* | 11/2017 | Qian | G06F 7/00 |

FOREIGN PATENT DOCUMENTS

| | | |
|---|---|---|
| JP | 2017-007126 A | 1/2017 |
| JP | 2017-47534 A | 3/2017 |
| WO | 2005/115663 A1 | 12/2005 |

\* cited by examiner

[Fig. 1]
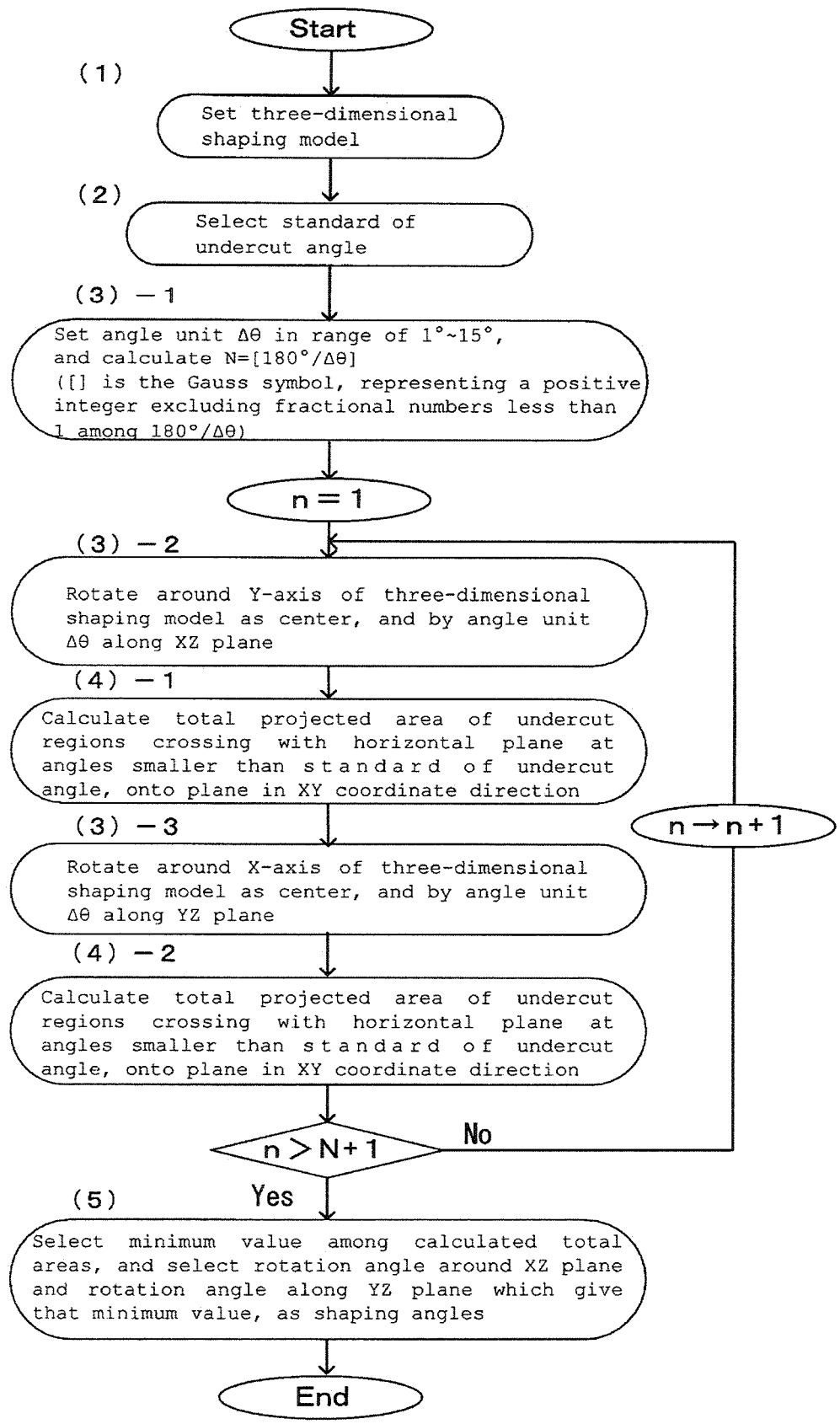

[Fig. 2]
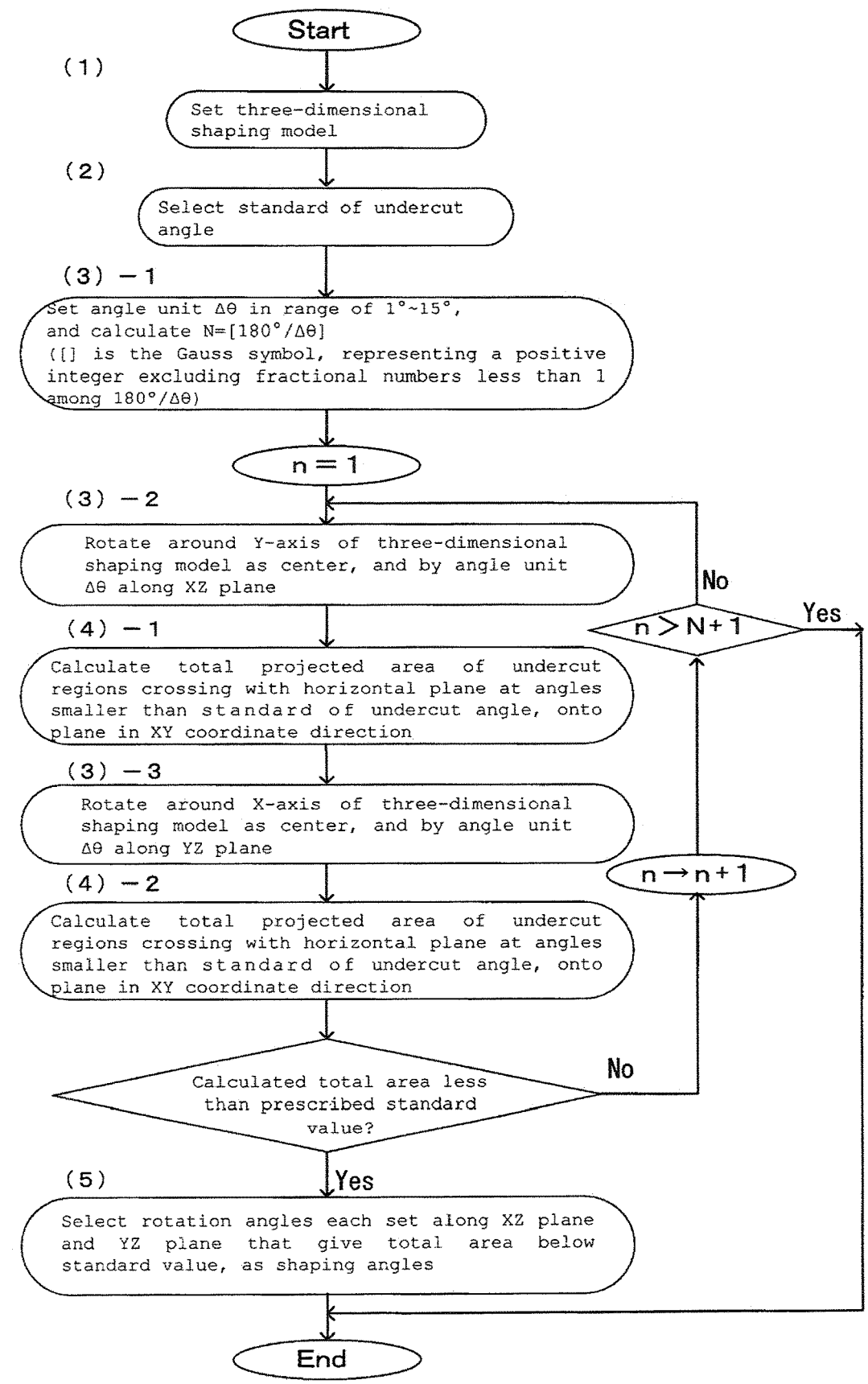

[Fig. 3] (a)
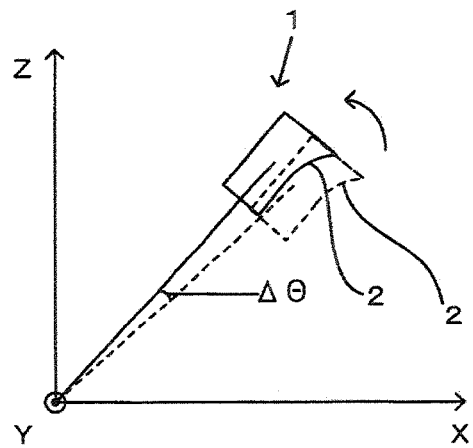
[Fig. 3] (b)
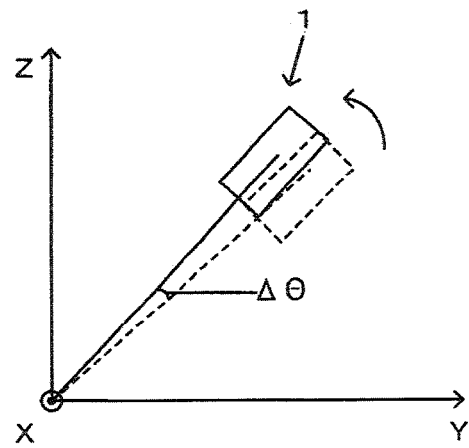
[Fig. 4] (a)
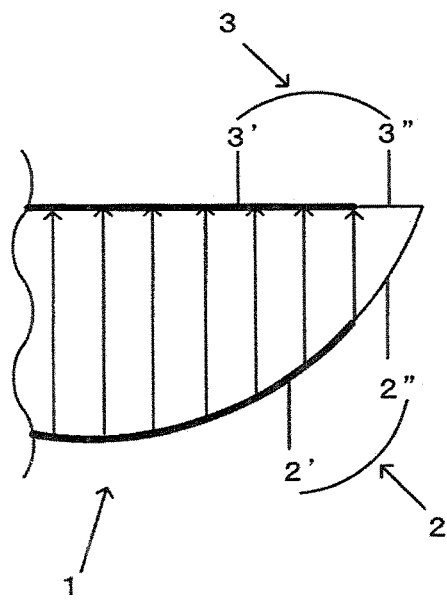
[Fig. 4] (b)
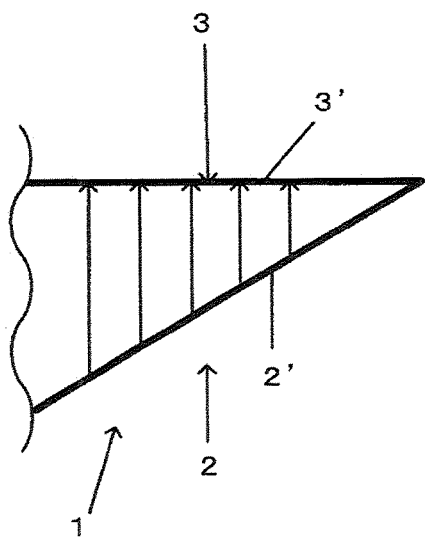

METHOD FOR THREE-DIMENSIONAL SHAPED PRODUCT WITH SETTING SHAPING ANGLE IN UNDERCUT REGION

BACKGROUND OF THE INVENTION

Technical Field

The present invention relates to a method for a three-dimensional shaped product with setting shaping angles in an undercut region wherein the three-dimensional shaped product is shaped by the steps of lamination, sintering and cutting in that order, the method being for shaping based on that order.

Background Art

The wall sections of three-dimensional shaped products have angles with respect to the horizontal direction that may change in a continuous manner or in an intermittent manner, but in either case, their lower regions sometimes form undercut regions with respect to the horizontal direction at locations of prescribed height on the wall sections, crossing at acute angles with respect to the horizontal direction.

When a crossing acute angle is smaller than a prescribed angle, accidents of three-dimensional shaped product deformation sometimes occur in the production stages following sintering due to the inherent weight of each region of the three-dimensional shaped product.

Such accidents tend to occur more easily when the area of the horizontal plane situated above the undercut region is large, and in order to prevent the accidents from occurring, it is common to employ a method for shaping a support section during shaping of the undercut region, supporting the undercut region from below.

In the prior arts, shaping of support sections is essentially the only measure employed to respond to such accidents.

An exception is Patent Document 1, wherein a bonding section (head section 50) is formed between the border region forming the undercut and the layer formed thereafter, thereby resulting in a structure that suppresses the brittleness, or tendency to deformation, of the undercut region (see paragraphs [0009] and [0054], FIG. 1, and FIG. 3).

However, disposing the above-described bonding section between the border region and the layer formed thereafter means an alteration of the design from the intended shape of the three-dimensional shaped product, and necessarily creates a hindrance to three-dimensional shaping.

PRIOR ART DOCUMENT

Patent Document

[Patent Document 1] Japanese Published Unexamined Patent Application No. 2017-47534

SUMMARY OF INVENTION

Technical Problem

It is an object of the present invention to provide a method for a three-dimensional shaped product with setting shaping angles that either may contribute to make support sections unnecessary in three-dimensional shaping, or reduce support sections to be minimum as possible.

Solution to Problem

In order to solve the aforementioned problems, the basic construction of the present invention comprises the following aspects (1) and (2).

(1) A method for a three-dimensional shaped product with setting shaping angles in an undercut region, in which steps of lamination with a squeegee, sintering with irradiation of a laser beam or electron beam and cutting by a traveling cutting tool are carried out in that order based on a program created by a CAD/CAM system, grounding on the following steps carried out by the CAD/CAM system on the aforementioned order for the three-dimensional shaped product.

1. A model for the three-dimensional shaped product is established in a three-dimensional space with XYZ axes.

2. At the wall sections of the model of step 1, a minimum angle is selected for the undercut region that crosses from below at an acute angle with respect to the horizontal direction, as an acute angle such that it does not deform under its own weight, and is defined as a standard of undercut angle.

3. For the model of step 1, rotation at an angle unit in the range of 1° to 15° along the XZ plane that is centered around the Y-axis and rotation at an angle unit in the range of 1° to 15° along the YZ plane that is centered around the X-axis, are each limited to being rotatable within a range of −180° to 180°.

4. For each angle unit rotation in step 3, the area of the undercut region crossing with the horizontal plane at a smaller angle than the standard of undercut angle, projected in the vertical direction with respect to the horizontal plane, i.e. the area in the XY plane, is assessed and the total area is calculated.

5. The rotation angle along the XZ plane and the rotation angle along the YZ plane in step 3, corresponding to the case where the total area in step 4 is minimum, are selected as the shaping angles.

6. when a minimum total area in step 5 is larger than a predetermined standard value, a command is sent to set a shaping region of a support section for supporting the undercut region.

(2) A method for a three-dimensional shaped product with setting shaping angles in which steps of lamination with a squeegee, sintering with irradiation of a laser beam or electron beam and cutting by a traveling cutting tool are carried out in that order based on a program created by a CAD/CAM system, grounding on the following steps carried out by the CAD/CAM system on the aforementioned order for the three-dimensional shaped product.

1. A model for the three-dimensional shaped product is established in a three-dimensional space with XYZ axes.

2. At the wall sections of the model of step 1, a minimum angle is selected for the undercut region that crosses from below at an acute angle with respect to the horizontal direction, as an acute angle such that it does not deform under its own weight, and is defined as a standard of undercut angle.

3. For the model of step 1, rotation at an angle unit in the range of 1° to 15° along the XZ plane that is centered around the Y-axis and rotation at an angle unit in the range of 1° to 15° along the YZ plane that is centered around the X-axis, are carried out within a range of −180° to 180°.

4. For each angle unit rotation in step 3, the area of the undercut region crossing with the horizontal plane at a smaller angle than the standard of undercut angle, projected in the vertical direction with respect to the horizontal plane, i.e. the area in the XY plane, is assessed and the total area is calculated.

5. When the total area in step 4 is less than the prescribed reference value, the rotation angles set along the XZ plane and YZ plane in step 3, corresponding to the reference value, are each selected as the shaping angles.

6. When all of total area in step 4 is larger than the predetermined standard value, a command is sent to set a shaping region of a support section for supporting the undercut region.

Advantageous Effects of Invention

According to the present invention standing on the basic constructions (1) and (2), it is possible to either produce a state in which no deformation occurs by the presence of undercut regions, or even if such a state is not produced, it is possible to create a state with less shaping of the support section compared to the prior art, thereby allowing more efficient and stable shaping of a three-dimensional shaped product having an undercut region.

BRIEF DESCRIPTION OF DRAWINGS

FIG. 1 is a flowchart showing the steps of the basic construction (1).

FIG. 2 is a flowchart showing the steps of the basic construction (2).

FIG. 3 is a side view showing states of rotation of a three-dimensional shaped product model by preset angle units in a CAD/CAM system, FIG. 3(a) showing the state of rotation around the XZ plane, and FIG. 3(b) showing the state of rotation around the YZ plane. In the case of the model shown in FIG. 3, the state is such that the undercut region can be observed on the XZ plane as shown in (a), whereas the undercut region cannot be observed on the YZ plane.

FIG. 4 is a pair of cross-sectional views showing projected states of undercut regions on the horizontal plane in step 3 (the upper arrows indicate the direction of projection), FIG. 4(a) showing a case where the undercut region has a curved surface and FIG. 4(b) showing a case where the undercut region is flat. The thick-line portions represent the undercut region crossing with the horizontal direction at a smaller angle than the standard of undercut angle, and the portion of the horizontal plane where the undercut region has been projected in the vertical direction, and the thin-line portions represent the undercut region crossing with the horizontal direction at a larger angle than the standard of undercut angle, and the portion of the horizontal plane where the undercut region has been projected in the vertical direction.

DESCRIPTION OF EMBODIMENTS

The basic constructions (1) and (2) are based on the technical assumption that production of the three-dimensional shaped product 1 is carried out by the following order of steps: lamination by traveling of a squeegee, sintering by irradiation of a laser beam or electron beam and cutting by a traveling cutting tool.

Each of the following steps are employed for the basic construction (1), on the basis of this technical assumption.

1. As shown in FIG. 1(1), a model for the three-dimensional shaped product 1 is established in a three-dimensional space with XYZ axes.

2. As shown in FIG. 1(2), at the wall sections of the model of step 1, a minimum angle is selected for the undercut region 2 that crosses from below at an acute angle with respect to the horizontal direction, as an acute angle such that it does not deform under its own weight, and is defined as a standard of undercut angle.

3. As shown in FIG. 1(3)-1, (3)-2, (3)-3 and FIG. 3, for the model of step 1, rotation at an angle unit in the range of 1° to 15° along the XZ plane that is centered around the Y-axis and rotation at an angle unit in the range of 1° to 15° along the YZ plane that is centered around the X-axis, are each limited to being rotatable within a range of −180° to 180°.

4. As shown in FIGS. 1(4)-1 and (4)-2, for each angle unit rotation in step 3, as shown in FIG. 4(a) and FIG. 4 (b), the area of the portion 2' of the undercut region 2 crossing with the horizontal plane at a smaller angle than the standard of undercut angle, wherein the angle crossing with the horizontal plane by the portion 2' is smaller than the standard of undercut angle, projected in the vertical direction with respect to the portion 3' of the horizontal plane 3 corresponding to region 2', i.e. the area in the XY plane, is assessed and the total area is calculated.

5. As shown in FIG. 1(5), the rotation angle along the XZ plane and the rotation angle along the YZ plane in step 3, corresponding to the case where the total area in step 4 is minimum, are selected as the shaping angles.

6. When a minimum total area in step 5 is larger than the predetermined standard value, a command is sent to set a shaping region of a support section for supporting the undercut region i undergone.

Likewise, each of the following steps are employed for the basic construction (2).

1. As shown in FIG. 2(1), a model for the three-dimensional shaped product 1 is established in a three-dimensional space with an XYZ axes.

2. As shown in FIG. 2(2), at the wall sections of the model of step 1, a minimum angle is selected for the undercut region 2 that crosses from below at an acute angle with respect to the horizontal direction, as an acute angle such that it does not deform under its own weight, and is defined as a standard of undercut angle.

3. As shown in FIG. 2 (3)-1, (3)-2, (3)-3 and FIG. 3, for the model of step 1, rotation at an angle unit in the range of 1° to 15° along the XZ plane that is centered around the Y-axis and rotation at an angle unit in the range of 1° to 15° along the YZ plane that is centered around the X-axis, are carried out within a range of −180° to 180°.

4. As shown in FIG. 2(4)-1, (4)-2, for each angle unit rotation in step 3, as shown in FIG. 4 (a) and FIG. 4 (b), the area of the portion 2' of the undercut region 2 crossing with the horizontal plane at a smaller angle than the standard of undercut angle, wherein the angle crossing with the horizontal plane by the portion 2' is smaller than the standard of undercut angle, projected in the vertical direction with respect to the portion 3' of the horizontal plane 3 corresponding to region 2', i.e. the area in the XY plane, is assessed and the total area is calculated.

5. As shown in FIG. 2(5), when the total area in step 4 is less than a prescribed standard value, the rotation angles set along the XZ plane and YZ plane in step 3, corresponding to the standard value, are each selected as the shaping angles.

6. When all of total area in step 4 is larger than the predetermined standard value, a command is sent to set a shaping region of a support section for supporting the undercut region.

For each step 2 described above, the standard of undercut angle in which deformation under its own weight does, not occur, can be determined by experiential rule, in advance with consideration of various factors such as the type of powder used as raw material for the three-dimensional shaped product 1, the degree of sintering, and the area of the undercut region 2 in the horizontal direction.

The minimum value will usually be set to 60°.

For step 5 of the basic construction (1), after the case where the total area is minimal has been selected, rotation by each angle unit in step 3 is carried out in the range of −180° to 180° where possible.

That is, the flowchart of FIG. 1 requires rotation along the XZ plane and YZ plane until reaching an angle such that n=N, where $\Delta\theta$ is set as the angle unit and N=[180°/$\Delta\theta$] ([ ] is the gauss symbol, representing a positive integer excluding fractional numbers less than 1 among 180°/$\Delta\theta$).

In contrast, with the actual basic construction (2), once the shaping angle is selected when the total area in step 4 is less than the standard value of certain extent in step 5, limiting the angle unit rotation in step 3 to the range of −180° to 180°, performing rotation along the XZ plane and YZ plane as much as possible, i.e. until reaching an angle such that n=N, in the flowchart of FIG. 2, is not necessarily essential.

However, when the total area has not reached the prescribed standard value in step 5, as shown in the flowchart of FIG. 2, the rotation is carried out until a state is reached as much as possible within the range of −180° to 180°, i.e. such that n=N.

In each step 3, for rotation along the XZ plane that is centered around the Y-axis and rotation along the YZ plane that is centered around the X-axis, a smaller angle unit of rotation results in a more precise condition of change in the total area in each step 4, and therefore time is required for calculation of the total area in each step 4.

On the other hand, a larger angle unit in each step 3 increases the speed of calculation of the total area in each step 4, but the condition of change in the total area must be approximated.

In each step 3, the unit angle is set to be 1° to 15° both for efficiency of each change in angle and for setting of a precise shaping angle.

When it is set to approximately 7°, however, it is possible to achieve both calculation speed and precision of the total area projected onto the horizontal plane in each step 4.

In each step 4, when the undercut region 2 is spherical or cylindrical, for example, having a curved surface that exceeds the standard of undercut angle, at the curved surface as shown in FIG. 4(*a*), it is sufficient to calculate the area corresponding to each undercut region 2, by projecting only the undercut regions 2' crossing with the horizontal plane at smaller angles than the standard of undercut angle onto the horizontal plane 3' in the vertical direction, and for the undercut regions 2" crossing with the horizontal plane at larger angles than the standard of undercut angle, it is not necessary to calculate the projection and the area based on the projection, i.e. the area with respect to the horizontal plane 3".

In contrast, when the undercut regions 2 are flat, and are undercut regions 2' crossing with the horizontal plane at smaller angles than the standard of undercut angle, as shown in FIG. 4(*b*), as long as no undercut regions 2" are present crossing with the horizontal plane at larger angles than the standard of undercut angle, the projected area for each undercut region 2 can be calculated from the area obtained by projecting the plane in the vertical direction onto the horizontal plane.

In step 4 of the basic construction (1), when multiple minimum total areas are present, any of them may be selected.

In such cases, however, by selecting the shaping angle to be the smallest total angle of an absolute value of the rotation angles along the XZ plane and an absolute value of the rotation angles along the YZ plane in step 3, it is possible to select a shaping angle with a low state of change with respect to the state of the model set in step 1.

Moreover, in the case described above, for the rotation in step 3, selecting the shaping angles for the largest sum of the angles crossing from below the horizontal plane of the undercut regions 2' that exhibit smaller angles than the standard of undercut angle, allows selection of shaping angles for a state that has the lowest likelihood of deformation from among the shaping angles exhibiting minimum values in step 4.

For step 5 of the basic construction (2), the shaping angles of the three-dimensional shaped product 1 are set at the stage of the first rotation on the XZ plane and rotation on the YZ plane such that the total area in the horizontal direction reaches the prescribed standard value.

This total area can be set by experiential rule based on separate experimentation, according to shape and material of the three-dimensional shaped product 1, and also the degree of sintering.

Examples of the present invention will now be described.

Example 1

In Example 1, when the command in step 6 is sent in the basic construction (1), a rotation angle in step 3 is selected that corresponds to the minimum total area, and then the CAD/CAM system sets the shaping region of the support section supporting the undercut region 2 located furthest outward in a crossing state.

With this feature, even if a suitable shaping angle has not been obtained by the minimum total area in Example 1, the shaping region of the support section can be reduced to an extremely minimal state compared to common shaping.

Example 2

As a feature of Example 2, when the command in step 6 is sent in the basic construction (2), each rotation angle in step 3, corresponding to the state of the smallest total area in step 4 is selected as the shaping angle, and then the CAD/CAM system sets the shaping region of the support section supporting the undercut region 2 located furthest outward, in a crossing state.

With this feature, even if a total area that is below the prescribed standard value has not been obtained in Example 2, the shaping region of the support section can be reduced to an extremely minimal state compared to conventional shaping.

INDUSTRIAL APPLICABILITY

By setting suitable shaping angles, the present invention can either prevent deformation in the production process for a three-dimensional shaped product, or can at least create a state with extremely reduced shaping of support sections, and therefore the present invention has a very wide range of applications.

REFERENCE SIGNS LIST

1: Three-dimensional shaped product
2: Undercut region

2': Regions among undercut regions having angles crossing the horizontal plane that are smaller than the standard of undercut angle 2": Regions among undercut regions having angles crossing the horizontal plane that are larger than the standard of undercut angle 3: Horizontal plane corresponding to undercut region 3': Horizontal plane among the horizontal planes in which the undercut region 2' is projected in the vertical direction 3": Horizontal plane among the horizontal planes in which the undercut region 2" is projected in the vertical direction

What is claimed is:

1. A method for a three-dimensional shaped product with shaping angles in an undercut region, in which steps of lamination with a squeegee, sintering with irradiation of one of a laser beam and electron beam and cutting by a traveling cutting tool are carried out in that order based on a program created by a CAD/CAM system, comprising the following steps carried out by the CAD/CAM system in the aforementioned order for the three-dimensional shaped product:
   1. establishing a model for the three-dimensional shaped product in a three-dimensional space with XYZ axes;
   2. selecting, at wall sections of the model of step 1, a minimum angle for the undercut region that crosses from below at an acute angle with respect to a horizontal direction, such that the undercut region does not deform under its own weight, and is defined as a standard of undercut angle;
   3. for the model of step 1, limiting rotation at an angle unit in a range of 1° to 15° along the XZ plane that is centered around the Y-axis and rotation at an angle unit in a range of 1° to 15° along the YZ plane that is centered around the X-axis, to being rotatable within a range of −180° to 180°;
   4. for each angle unit rotation in step 3, assessing and calculating a total area of the undercut region crossing with the horizontal plane at a smaller angle than the standard of undercut angle, projected in a vertical direction with respect to the horizontal plane corresponding to an area in the XY plane;
   5. selecting the rotation angle along the XZ plane and the rotation angle along the YZ plane in step 3, corresponding to the case where the total area in step 4 is minimum, as the shaping angles; and
   6. when a minimum total area in step 5 is larger than a predetermined standard value, sending a command to set a shaping region of a support section for supporting the undercut region.

2. The method for a three-dimensional shaped product according to claim 1, further comprising the step of, when multiple minimum total areas are present in step 4, selecting the shaping angle which gives the smallest total angle for an absolute value of the rotation angles along the XZ plane and an absolute value of the rotation angles along the YZ plane in step 3.

3. The method for a three-dimensional shaped product according to claim 1, further comprising the step of, when multiple minimum total areas are present in step 4, selecting the shaping angle which gives the largest sum of angles crossing from below the horizontal planes of the undercut regions exhibiting smaller angles than the standard of undercut in the rotation in step 3.

4. The method for a three-dimensional shaped product according to claim 1, further comprising the steps of:
   when the command in step 6 is sent, selecting a rotation angle in step 3 that corresponds to the minimum total area, and
   then setting by the CAD/CAM system sets the shaping region of the support section supporting the undercut region located furthest outward in a crossing state.

5. The method for a three-dimensional shaped product according to claim 1, wherein the standard of undercut angle is 60°.

6. A method for a three-dimensional shaped product with shaping angles in an undercut region, in which steps of lamination with a squeegee, sintering with irradiation of one of a laser beam and electron beam and cutting by a traveling cutting tool are carried out in that order based on a program created by a CAD/CAM system, comprising the following steps carried out by the CAD/CAM system in the aforementioned order for the three-dimensional shaped product:
   1. establishing a model for the three-dimensional shaped product in a three-dimensional space with XYZ axes;
   2. selecting, at wall sections of the model of step 1, a minimum angle for the undercut region that crosses from below at an acute angle with respect to a horizontal direction, such that the undercut region does not deform under its own weight, and is defined as a standard of undercut angle;
   3. for the model of step 1, carrying out rotation at an angle unit in a range of 1° to 15° along the XZ plane that is centered around the Y-axis and rotation at an angle unit in a range of 1° to 15° along the YZ plane that is centered around the X-axis, within a range of −180° to 180°;
   4. for each angle unit rotation in step 3, assessing and calculating a total area of the undercut region crossing with the horizontal plane at a smaller angle than the standard of undercut angle, projected in a vertical direction with respect to the horizontal plane corresponding to an area in the XY plane;
   5. when the total area in step 4 is less than a prescribed standard value, selecting the rotation angles set along the XZ plane and YZ plane in step 3, corresponding to the standard value, as the shaping angles; and
   6. when all of total area in step 4 is larger than a predetermined standard value, sending a command to set a shaping region of a support section for supporting the undercut region.

7. The method for a three-dimensional shaped product according to claim 6, further comprising the steps of:
   when the command in step 6 is sent, selecting each rotation angle in step 3, corresponding to the state of the smallest total area in step 4, is selected as the shaping angles, and
   then setting by the CAD/CAM system the shaping region of the support section supporting the undercut region located furthest outward, in a crossing state.

8. The method for a three-dimensional shaped product according to claim 6, wherein the standard of undercut angle is 60°.

* * * * *